United States Patent
Tamura et al.

[11] Patent Number: 5,906,684
[45] Date of Patent: May 25, 1999

[54] METHOD OF HOLDING SUBSTRATE AND SUBSTRATE HOLDING SYSTEM

[75] Inventors: Naoyuki Tamura; Kazue Takahashi; Youichi Ito; Yoshifumi Ogawa; Hiroyuki Shichida, all of Kudamatsu; Tsunehiko Tsubone, Hikari, all of Japan

[73] Assignee: Hitachi, Ltd., Tokyo, Japan

[21] Appl. No.: 09/050,417

[22] Filed: Mar. 31, 1998

Related U.S. Application Data

[63] Continuation of application No. 08/307,238, Sep. 16, 1994, Pat. No. 5,792,304.

[30] Foreign Application Priority Data

Sep. 16, 1993 [JP] Japan ................................. 5-230187
Mar. 18, 1994 [JP] Japan ................................. 6-48286

[51] Int. Cl.⁶ .......................... C23C 16/00; H05H 1/00
[52] U.S. Cl. .................. 118/728; 118/724; 118/500; 279/128; 361/234; 156/345
[58] Field of Search ........................ 118/724, 728, 118/500; 156/345; 279/128; 361/234

[56] References Cited

U.S. PATENT DOCUMENTS

| | | | |
|---|---|---|---|
| 4,565,601 | 1/1986 | Kakehi et al. | 156/643 |
| 5,103,367 | 4/1992 | Horwitz et al. | 361/234 |
| 5,160,152 | 11/1992 | Toraguchi et al. | 279/128 |
| 5,213,349 | 5/1993 | Elliot | 279/128 |
| 5,230,741 | 7/1993 | Van De Ven et al. | 118/728 |
| 5,310,453 | 5/1994 | Fukasawa et al. | 156/643 |
| 5,320,982 | 6/1994 | Tsubone et al. | 437/228 |
| 5,382,311 | 1/1995 | Ishikawa et al. | 156/345 |
| 5,443,689 | 8/1995 | Kimura et al. | 216/63 |
| 5,474,614 | 12/1995 | Robbins | 118/728 |
| 5,511,799 | 4/1996 | Davenport et al. | 277/236 |
| 5,516,367 | 5/1996 | Lei et al. | 118/725 |
| 5,531,835 | 7/1996 | Fodor et al. | 118/728 |
| 5,576,483 | 11/1996 | Bonin | 73/105 |
| 5,698,070 | 12/1997 | Hirano et al. | 156/643.1 |
| 5,792,304 | 8/1998 | Tamura et al. | 156/345 |

FOREIGN PATENT DOCUMENTS

| | | |
|---|---|---|
| 0357424 | 8/1989 | European Pat. Off. . |
| 0452222 | 4/1991 | European Pat. Off. . |
| 58-32410 | 2/1983 | Japan . |
| 5226292 | 3/1993 | Japan . |

OTHER PUBLICATIONS

IBM Technical Disclosure Bulletin, "Electrostatic Wafer Holder for Wafer Cooling During Reactive Ion Etching", vol. 31, No. 1, Jun. 1988.

Primary Examiner—R. Bruce Breneman
Assistant Examiner—J. Lund
Attorney, Agent, or Firm—Antonelli, Terry, Stout & Kraus, LLP

[57] ABSTRACT

In a method of holding a substrate and a substrate holding system where, the amount of foreign substances on the back surface of the substrate can be decreased and only a small amount of foreign substances transferred from a mounting table to the substrate. For this purpose, the substrate holding system has a ring-shaped leakage-proof surface providing a smooth support surface on the specimen table corresponding to the periphery of the substrate, a plurality of contact holding portions which bear against the substrate on the specimen table between the corresponding position to the periphery of the substrate and the corresponding position to the center of the substrate, and electrostatic attraction means for fixing the substrate by contacting the back surface of the substrate to the ring-shaped leakage-proof surface and the contact holding portions. The substrate is exposed to a cooling surface at the ring-shaped leakage-proof surface and the contact holding portion placed at a position inside the ring-shaped leakage-proof surface. The back surface of the substrate and the cooling surface do not contact each other in the large portion of the remaining area.

21 Claims, 9 Drawing Sheets

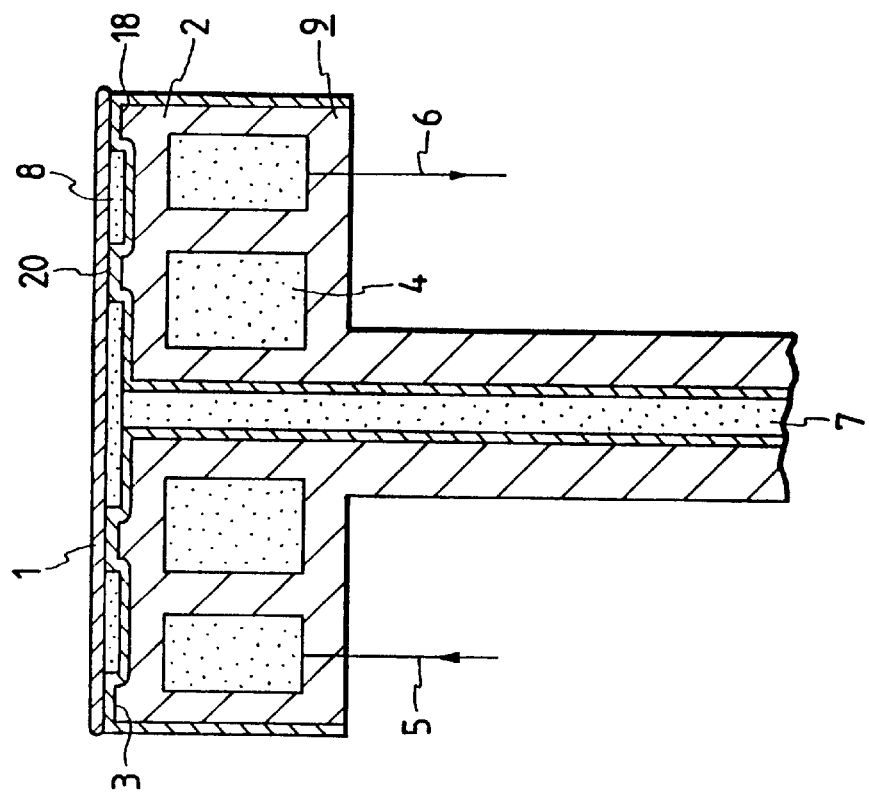
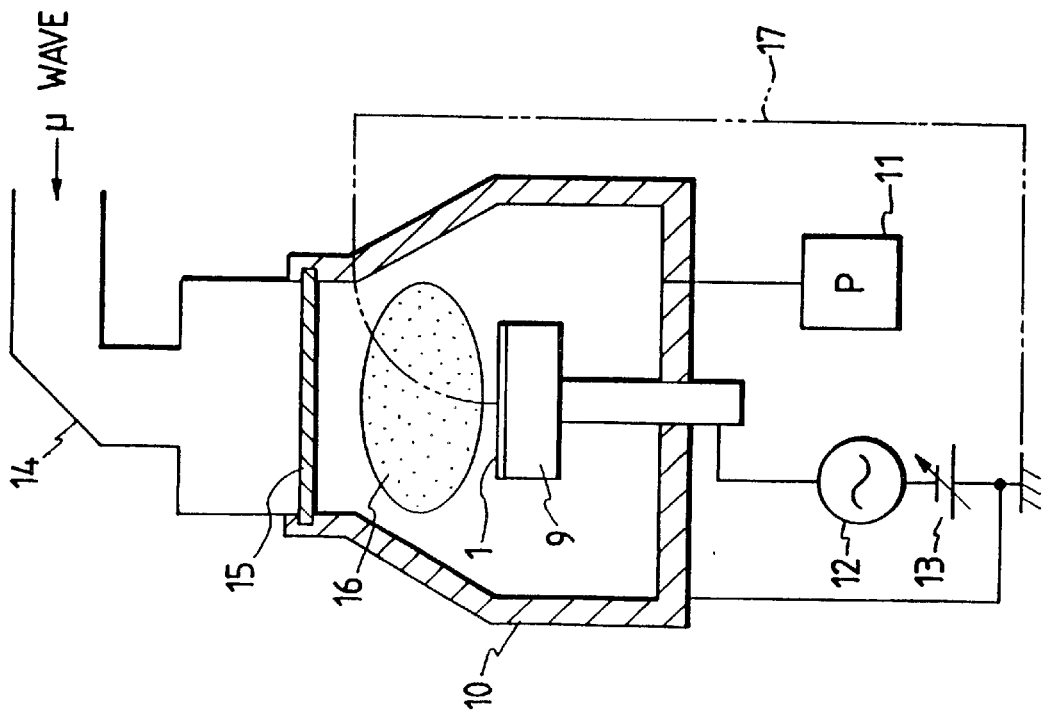

METHOD OF HOLDING SUBSTRATE AND SUBSTRATE HOLDING SYSTEM

This application is a continuation of application Ser. No. 08/307,238 filed Sep. 16, 1994, now U.S. Pat. No. 5,792,304, the entire disclosure of which is hereby incorporated by reference.

BACKGROUND OF THE INVENTION

The present invention relates to a method of holding a substrate and a substrate holding system to hold a substrate securely during a production process for treating the substrate, such as semiconductor device, while it is being cooled.

Among substrate treating apparatuses for production of semiconductor devices, there are a lot of substrate treating apparatuses requiring the cooling substrates, such as a plasma treatment apparatus, a sputtering apparatus, a dry etching apparatus, a CVD (chemical vapor deposition) apparatus and a high energy ion implantation apparatus. Since the treating environment in these apparatuses is generally a vacuum, it is difficult to cool a substrate by bringing it into contact with a cooling surface, as in atmospheric pressure, because of the decrease in thermal conductivity which occurs in a vacuum. Although there is abundant literature concerning thermal conductivity in a vacuum (rarefied gas), the amount of heat transferred by contact is small because of the small real contact area when surfaces come into contact with each other. Especially in heat transfer between a substrate and a cooling surface, it is difficult to strongly press the substrate against the cooling surface since there is a possibility to damage the substrate. Therefore, various ideas, such as placing a soft elastomer on the surface contacting the substrate, have been proposed. However, in recent years, it has been more conventional for a gas to be introduced between the substrate and a cooling surface to cool the substrate using the gas as a coolant, when the heat load in the substrate increases or a requirement to cool the substrate to lower the temperature thereof arises.

There are various types of gas cooled substrate holding systems. They can be roughly categorized as follows: (1) a gas cooling type system where the back surface of a substrate and a cooling surface contact each other and a gas is introduced into the gap between the surfaces formed by the surface roughness, and (2) a gas cooling type system where the back surface of a substrate and a cooling surface do not contact each other and a gas is introduced into the gap between the surfaces.

The prior art gas cooling type systems belonging to the former category (1) are described in, for example, Japanese Patent Publication No. 2-27778 (1990), Japanese Patent Application Laid-Open No. 62-274625 (1987), Japanese Patent Application Laid-Open No. 1-251375 (1989), Japanese Patent Application Laid-Open No. 3-154334 (1991) and Japanese Utility Model Application Laid-Open No. 4-8439 (1992). And, the prior art gas cooling type systems belonging to the latter category (2) are described in, for example, Japanese Patent Application Laid-Open No. 63-102319 (1988), Japanese Patent Application Laid-Open No. 2-312223 (1990), Japanese Patent Application Laid-Open No. 3-174719 (1991). Further, there is another type of system, described in Japanese Patent Application Laid-Open No. 2-30128 (1990), where, before introducing a cooling gas, the back surface of a substrate and a cooling surface are brought into contact with each other, but during cooling the substrate is pushed up due to gas pressure caused by introducing the cooling gas and does not contact the cooling surface.

In these cooling systems, providing that a certain cooling gas is used, the cooling capacity (magnitude of transferred heat) with the cooling gas depends on the pressure of the gas and the distance between the back surface of a substrate and the cooling surface (gap in the back surface of the substrate). FIG. 8 schematically shows the characteristic of thermal conductivity in a low pressure situation. When the pressure of the cooling gas is low, the amount of transferred heat is proportional to the pressure of the cooling gas and independent of the magnitude of the gap between both of the surfaces. When the pressure of the cooling gas is higher than the pressure PO, where the mean free path of the cooling gas nearly coincides with the gap, the amount of transferred heat becomes constant and independent of the gas pressure. The pressure of the cooling gas in the type of system in category (1) described above is generally in the region where the heat transfer is proportional to pressure, and the pressure of the cooling gas in the type of system in category (2) described above is generally in the region where the heat transfer is independent of pressure.

Characteristics and problems in various methods of cooling a substrate will be described below.

First, a description will be made on the case where cooling is performed under a condition that a substrate contacts a cooling surface. The cooling methods belonging to this type are disclosed in Japanese Patent Publication No. 2-27778 (1990), Japanese Patent Application Laid-Open No. 62-274625 (1987), Japanese Patent Application Laid-Open No. 1-251375 (1989), Japanese Patent Application Laid-Open No. 3-154334 (1991) and Japanese Utility Model Application Laid-Open No. 4-8439 (1992). In the cooling method of this type, although the substrate and the cooling surface contact each other, only the most protruding portions on the cooling surface contact the substrate when it is observed in detail. The indented portions on the cooling surface and on the substrate do not contact each other, and the gaps are approximately 10 µm to 50 µm, although this depends on the surface roughness. In a case where a cooling gas is introduced in the gap, the pressure is generally several Torrs, which is in a region nearly equal to the mean free path. Therefore, a sufficient cooling efficiency can be obtained by properly setting the pressure as shown in FIG. 8.

However, when the cooling gas is supplied from a specified single portion, as shown in the figure in Japanese Patent Publication No. 2-27778 (1990), the pressure is highest in the cooling gas supplying portion and decreases as it goes toward the peripheral portion of the substrate. Since the cooling efficiency has a pressure dependence as shown in FIG. 8, there arises a disadvantage that uniformity of the temperature distribution is deteriorated due to the non-uniformity of the cooling efficiency. If there is no gas leakage, that is, no gas flow, the pressure distribution does not occur and the temperature distribution becomes uniform. However, in order to achieve this, the peripheral portion of the substrate needs to be shielded. This is described in Japanese Patent Application Laid-Open No. 62-274625 (1987) or in Japanese Utility Model Application Laid-Open No. 2-135140. Further, the method in which cooling gas is supplied from plural portions to make the pressure distribution on the back of the substrate uniform is described in Japanese Patent Application Laid-Open No. 1-251735 (1989) or in Japanese Patent Application Laid-Open No. 4-61325 (1992). In any case, in these cooling methods, since the back surface of the substrate and the cooling surface contact each other in a large area, there is a disadvantage in that a lot of foreign substances become attached to the back surface of the substrate when contacting the cooling surface.

Further, in order to prevent the cooling gas from leaking through the peripheral portion of the substrate using a shielding material, a load for the shielding needs to be applied. Therefore, a way of tightly fixing the substrate in some manner is required.

Description will be made below of a cooling method where a substrate and a cooling surface do not contact each other and a cooling gas is supplied into the gap. The prior art method is described in Japanese Patent Application Laid-Open No. 3-174719 (1991) or in Japanese Patent Application Laid-Open No. 4-6270 (1992), in which a substrate is mechanically fixed to a cooling surface from the top surface or the side surface of the substrate. Since the substrate, in these examples, is mechanically fixed, there is a disadvantage that foreign substances are apt to be produced at the fixing portion. In the methods described in Japanese Patent Application Laid-Open No. 63-102319 (1958) and in Japanese Patent Application Laid-Open No. 2-30128 (1990), a substrate is not fixed specially, but is held by the weight of the substrate itself. In this case, in order that the leakage of the cooling gas is not increased too much or the substrate is not caused to float up, the pressure of the cooling gas has to be limited to a low level. This causes a disadvantage in that the cooling efficiency is decreased.

Electrostatic adhesion is a known method of fixing a substrate electrically. An example where a substrate is fixed to a cooling surface with this method and projections are provided on the periphery of the substrate is described in Japanese Patent Application Laid-Open No. 62-208647 (1987). A substrate contacts a cooling surface only at a plurality of projections provided in separate spaced relation on the outer periphery and inner periphery of the substrate, which is described in the Japanese Patent Application Laid-Open No. 62-208647 (1987). And, this publication indicates that cooling gas easily leaks and that the adhering force is unstable. Further, in order to improve this method, it is effective if the outer periphery is not projected and the projections are provided only on the inner peripheral portions, and further, if the projections in the inner periphery are provided in the central portion, instead of in separate spaced relation. In this case, the gap between the substrate and the cooling surface becomes non-uniform over the surface of the substrate, which causes a non-uniform pressure distribution on the back surface of the substrate. When the gap between the back surface of the substrate and the cooling surface varies from one position to another, the ratio of the mean free path of the cooling gas and the gap has an uneven distribution over the surface of the substrate. Therefore, a disadvantage arises in that the temperature distribution is apt to become large due to the difference in cooling efficiency, as can be understood from FIG. 8, even if the pressure distribution is not so large. In the electrostatic adhering method described in this example, there are provided positive and negative electrodes on the cooling portion to which a direct current high voltage is applied to produce an electrostatic adhering force. In the electrostatic adhering method of this type, there may arise a disadvantage in that, when a substrate is treated in a plasma, the electric charge on the surface of substrate produced by irradiated ions or electrons is apt to be non-uniform, and so a current flows on the surface of substrate to damage the substrate.

Each of the conventional technologies, as described above, has the main objective of cooling a substrate efficiently. However, with an increase in integration of semiconductor devices in recent years, it is required to decrease the amount of small foreign substances, such as particles or dust and heavy metal impurities, to less than the allowable limit in the past. The same can be said for foreign substances attached on the back surface of a substrate. When the amount of foreign substances attached on the back surface of a substrate is large, there arises a disadvantage in the next process in that the foreign substances on the back surface are attached to the top surface of an adjacent substrate, or are removed first from the substrate and attached to another substrate. Therefore, decreasing the amount of foreign substances is an important problem for stabilizing the semiconductor production process or improving the yield. Attaching of foreign substances on the back surface of a substrate occurs by contacting the back surface of the substrate to another member. Therefore, a lot of foreign substances are attached to a substrate by contacting a cooling surface for the substrate.

Further, the prior art does not refer to the consideration of substrate size. Although it is mentioned that the influence upon the process is lessened by leaking cooling gas into the treating chamber, with the adhering force being as small as possible, the relation between the adhering force and the cooling gas pressure is not mentioned.

A conventional substrate holding system in a substrate etching apparatus generally employs a method in which a substrate is pressed along its periphery with hooks, as described in Japanese Patent Application Laid-Open No. 2-148837 (1990) or Japanese Patent Application Laid-Open No. 2-267271 (1990). When there is such a member contacting the surface of the substrate, problems arise in that the contact portions in the substrate are obstructed by the etching, the contacting member itself being also etched to some extent together with the substrate. As a result, the foreign substance sources, such as reaction products, are attached to the contacting member and the contacting member may be damaged, which may lead to production of foreign substances.

On the other hand, in a substrate holding method in which a substrate is held using electrostatic force (hereinafter, referred to as "electrostatic adhering"), as described in, for example, Japanese Patent Application Laid-Open No. 2-135753 (1990), a substrate is placed on an electrostatic adhering portion made of a dielectric material and a high voltage is applied to hold the substrate with an electrostatic adhering force. In this case, there is no special member to press the substrate in the periphery of the substrate. Therefore, the problem of the possibility of producing foreign substances as described in the above example is solved. However, the positional relationship between the substrate and the electrostatic adhering member is such that the substrate is placed in the uppermost position (substrate etching space side) and a step is formed in the electrostatic member such that the electrostatic adhering member comes to be placed below the substrate. When such a step exists, gas flow during etching a substrate changes abruptly at the periphery of the substrate to cause a non-uniform etching in the substrate in some cases.

SUMMARY OF THE INVENTION

An object of the present invention is to provide a method of holding a substrate and a substrate holding system in which the amount of foreign substances on the back surface can be decreased, and only a small amount of foreign substances may be transferred from a mounting table to a substrate.

Another object of the present invention is to provide a method of holding a substrate and a substrate holding system where the deformation in a large diameter substrate can be suppressed, and the cooling efficiency for the substrate can be kept sufficiently high.

A further object of the present invention is to provide a method of holding a substrate and a substrate holding system in which damage to the substrate caused during treating the substrate can be prevented.

A still further object of the present invention is to provide a method of holding a substrate and a substrate holding system in which a cooling gas can be quickly dispersed over the back surface of a substrate when the cooling gas is introduced, after the substrate is electrostatically attracted, and substrate temperature control suitable for high productivity can be performed.

Another object of the present invention is to improve the product yield of substrate etching and the availability of the substrate etching apparatus providing a substrate holding system which is subjected to a reduced amount of foreign substances as described above and is capable of performing uniform etching.

According to the present invention, there is provided a ring-shaped leakage-proof surface having a smooth surface on the specimen table corresponding to the periphery of the substrate, a plurality of contact holding portions which bear against and support the substrate on the specimen table between the corresponding position to the periphery of the substrate and the corresponding position to the center of the substrate, and electrostatic attraction means for generating an electrostatic attraction force to attract the substrate toward the ring-shaped leakage-proof surface and the contact holding portions.

In order to decrease the amount of foreign substances which may adhere on a substrate, it is effective to decrease the contact area between a cooling surface and a substrate. However, the distance between the cooling surface and the back surface of the substrate needs to be kept at a distance so as not to decrease the cooling efficiency of a cooling gas. In order to realize this, a small high step is provided on the cooling surface, such that the back surface of the substrate and the cooling surface do not contact each other whether the cooling gas is introduced or not. Although the cooling surface and the back surface of the substrate contact each other at protruding portions provided on the step portion of the cooling surface, the area of the contact portions needs to be limited so as to be as small as necessary. In the present invention, therefore, an electrostatic attraction function is given to the cooling surface to attract the substrate to the protruding portions of the cooling surface.

Prevention of leakage of the cooling gas has to be considered. According to the present invention, this can be attained by providing a ring-shaped protruding portion having a smooth surface, that is, leakage-proof surface, on the cooling surface corresponding to the peripheral portion of a substrate, and fixing the back surface of the substrate to the cooling surface with electrostatic adhesion to prevent the cooling gas from leaking.

According to the present invention, the following effects are obtained. One of the effects is a solution for the problem concerning the transportation of foreign substances in a pusher portion relating to handling of the substrate. The pusher provided inside or through a mounting table contacts other members and cannot avoid a foreign substance source. In the present invention, the excess cooling gas flows toward the opposite side of the mounting table through the hole. Since the foreign substances produced are carried in the opposite direction to the substrate, the amount of foreign substances attached to the substrate is decreased.

Another effect of the present invention is that a cover is provided in the back surface of the mounting table to protect the mechanism in the back surface of the mounting table from being contaminated by reaction products over a long time of use as much as possible. Since complex mechanisms, such as the coolant supplying system and the vertical driving mechanism for the mounting table, are usually constructed in the back of the mounting table, it is troublesome when the reaction products produced by etching attach to these parts. In order to avoid this, according to the present invention, a cover is provided in the back surface of the mounting table such that the excess cooling gas flows into the inside of the cover, the pressure inside the cover being kept higher than the pressure in the treatment chamber during treating to suppress the reaction products from entering the treatment chamber, which protects the mechanism in the back surface of the mounting table from contamination by reaction products over a long time of use.

The prevention of damage to the substrate can be attained by connecting the electric circuit for electrostatic adhesion from the substrate side to a grounded part, such as the vacuum chamber, through the plasma to minimize the electric potential over the surface of the substrate.

According to the present invention, a substrate contacts a cooling surface at a ring-shaped leakage-proof surface and at contact holding portions positioned inwardly of the ring-shaped leakage-proof surface. However, since the back surface of the substrate does not contact the cooling surface in most of the remaining part of the area, attaching of foreign substances caused by contact can be prevented. Although the cooling efficiency for the substrate cooling is decreased a little compared to when the substrate contacts the cooling surface under the same pressure of the cooling gas, a sufficient cooling efficiency can be obtained by forming a step on the cooling surface smaller than approximately 100 times the mean free path of the cooling gas. The gap between the back surface of the substrate and the cooling surface is large in comparison to that in the conventional cooling method, where the substrate and cooling surface contact each other over the whole surface. Therefore, the conductance between both surfaces is large so that supplying and exhausting of cooling gas are easily performed. That is, the time to supply and exhaust the cooling gas is short, and so the time for treating a substrate can be shortened. Further, there is a function that the conductance at the contact portion of the periphery of the substrate and the cooling surface is very small in comparison to the non-contact portion of the inner portion of the substrate (in the molecular flow region, the conductance is proportional to the square of gap), the pressure difference across the non-contact portion being small, that is, the cooling efficiency being uniform.

When the substrate temperature is controlled using a cooling gas as a coolant, the pressure of the cooling gas is required to be higher than 2 Torrs. And, the higher the pressure is, the higher the efficiency of heat transfer becomes. On the other hand, the electrostatic adhering force largely depends on the temperature of the substrate being controlled. In a typical production line today, the temperature is approximately −60° C. to +100° C., and an adhering force of 40 to 100 gf/cm$^2$ is stably obtained under an applied voltage in general of 300 to 1000 V. Concerning the pressure control of the cooling gas, it is difficult to control the pressure precisely, since the pressure largely changes depending on the time constant of the gas supplying system or the relationship between the relative roughnesses of the contact surfaces of the substrate and the mounting table. Therefore, the target of the pressure control may be, for example, 10 Torrs±5 Torrs.

When the outer periphery of the substrate is fixed by adhesion with the conventional method and a gas is filled in the back of the surface with the pressure of 10 Torrs, the substrate is deformed by 0.1 to 0.25 mm. This magnitude of deformation degrades the work accuracy of substrate etching as well as lessens the heat transfer efficiency of the cooling gas. To solve this problem, adhering portions are additionally provided on the center side of a substrate, for example, one ring-shaped adhering portion for a 6" substrate, two ring-shaped adhering portions for an 8" substrate, in addition to the adhering portion on the periphery of the substrate. Therewith, the deformation can be prevented.

It is well known that when a substrate contacts another member, foreign substances are certainly attached to the contact point. From this point of view, it is clearly preferable that the electrostatic adhering surface is small. However, taking the pressure control level and adhering force into consideration as described above, it is suitable in the up-to-date technical level that the adhering area is less than approximately half of the total area of the substrate. This is because, when the electrostatic adhering force is 40 $gf/cm_2$ and the adhering area is half of the total area, the total adhering force for an 8" substrate becomes approximately 6280 gf, and the separating force with the cooling gas of 15 Torrs is approximately 6100 gf.

Further, by providing a pusher for substrate transportation in a hole penetrating the back surface of the mounting table, the excess cooling gas serves as a carrier gas for carrying foreign substances produced at the pusher portion to prevent the foreign substances from attaching to the substrate. In addition to this, the excess cooling gas is introduced into the inside of a cover on the back surface of the mounting table and makes the pressure inside the cover higher than the pressure in the treating chamber to prevent contamination of and attaching of reaction products to the mechanisms on the back of the mounting table.

In order to prevent abnormal discharge from occurring when the high frequency voltage is applied to the substrate to generate a bias voltage for etching the substrate, a high frequency voltage applying portion and a standard electric potential portion are insulated with an electrical insulating material so as not to face each other directly. In addition to the above measures, a pin for transporting the substrate is provided and is constructed so as to be electrically conductive. Since the electrostatic adhering force due to a remaining charge can be instantaneously dissipated by removing the charge accumulated in the substrate by causing the pin to contact the substrate when the substrate is transported, the substrate is not lifted with unnecessary force.

Since the flow passage to conduct the coolant for controlling the temperature of the substrate is formed by diffusion welding or soldering in such a structure that the portion forming the flow passage is completely jointed, no seal is required when a through hole is provided in any place except the flow passage. Therefore, a temperature detector or a detector for detecting the presence or absence of substrate can be easily provided.

In order to make the gas flow on the surface of a substrate uniformly, a gas flow controlling member (hereinafter referred to as a "susceptor") is provided in the outer peripheral portion of the substrate. The surface of the susceptor is at a higher level than that of the substrate so that the gas flow does not abruptly change direction at the periphery of the substrate. The surface of the susceptor facing the periphery of the substrate is formed normal to the surface of the substrate to restrict movement in the lateral direction or sliding of the substrate. Further, there are some cases in which the reaction products produced by substrate etching or the plasma flows into the gap between the cover member facing the back surface of the substrate in the peripheral portion and the back surface of the substrate to cause foreign substances to attach on the back surface of the substrate. This phenomena is prevented by the distance between the back surface of the substrate and the cover member.

As described above, since contact between a foreign substance source and a substrate is eliminated as far as possible, the transfer of foreign substances to the substrate can be decreased. Further, since the gas flow is made uniform, the uniformity in the substrate etching over the surface can be improved. Since the detector for measuring substrate temperature and the detector for detecting the presence or absence of a substrate can be easily installed by modification of the structure and the manufacturing method of the substrate holding system, the reliability and the operability of the apparatus can be improved.

BRIEF DESCRIPTION OF THE DRAWINGS

FIG. 1 is a vertical cross-sectional view showing an outline of a substrate treatment apparatus to which a substrate holding system in accordance with the present invention is applied.

FIG. 2 is a vertical cross-sectional view showing an embodiment of the substrate holding system in FIG. 1.

DETAILED DESCRIPTION OF THE PREFERRED EMBODIMENTS

Figure 3:
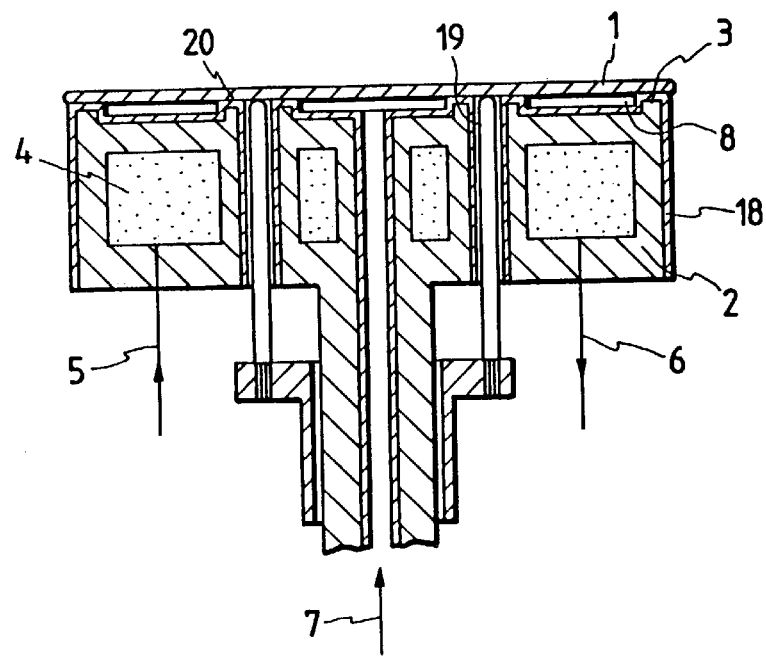
FIG. 3 is a vertical cross-sectional view showing another form of the substrate holding system to be used in the apparatus of FIG. 1.

As a first embodiment according to the present invention, FIG. 1 shows substrate treatment apparatus employing an electrostatic adhering circuit for fixing a substrate 1 to a substrate holding system 9. In FIG. 1, a microwave plasma etching apparatus is used for treating the substrate 1. A substrate holding system 9 mounting the substrate 1 is placed in an etching chamber 10. The etching chamber 10 is exhausted using a vacuum pump 11, and a gas for etching is supplied from a gas supply unit. The substrate holding system 9 is connected to a high frequency power source 12 and a direct current power source 13. Microwave energy is introduced into the etching chamber 10 from a quartz glass window 15 through a waveguide 14. When the high frequency power source 12 is switched into operation or the microwave is introduced, a plasma 16 is produced in the etching chamber 10. At that time, an electrostatic adhering circuit 17 is formed by the potential of the direct current power source 13 through the substrate holding system 9, the substrate 1, and the plasma 16. In this state, the substrate 1 is fixed to the substrate holding system 9, that is, fixed by the electrostatic force produced in the substrate holding system 9.

FIG. 2 shows a cross-section of the substrate holding system 9 in FIG. 1. A substrate 1 is mounted on protruding portions 3 and 20 of a holding member 2 for holding the substrate, the protruding portion 3 of the holding member 2 being connected in the electrostatic adhering circuit 17, the substrate 1 being fixed to the holding member 2 at the portions 3 and 20. A flow passage for supplying a coolant 4 is provided in the holding member 2 to cool the substrate 1. The coolant is supplied from a supplying unit to an inlet portion 5, schematically illustrated, and flows out from an outlet portion 6 to control the temperature of the holding member 2. Further, a flow passage for a cooling gas 7 is provided in the center of the holding member 2 to supply and exhaust the cooling gas 7. The temperature control of the substrate 1 is attained by the cooling gas 7 which flows into the indented portion 8 of the holding member 2 so as to perform a heat transfer between the holding member 2 and the substrate 1. The electrostatic adhering force is generated by a dielectric material 18 attached to or formed on the surface of the holding member 2.

Aluminum oxide, or mixture of aluminum oxide added to titanium oxide, may be used as the dielectric material 18. A voltage of several hundred volts is applied to the holding member as a direct current voltage for generating the electrostatic force. Therewith, the substrate is electrostatically fixed to the protruding portion 3 of the holding member 2 shown in FIG. 2. The electric potential for electrostatic adhering is applied from the direct current power source 13, the potential being uniform over the holding member 2, over the protruding portion 3 and over the outer periphery of the substrate 1. Therefore, the potential difference produced over the surface of the substrate 1 is caused by the distribution of electrons or ions irradiated on the substrate 1, and is not so high that the potential difference may cause damage to the substrate 1. On the other hand, in a method where positive and negative electric poles are formed in the holding member 2 to cause the substrate to adhere electrostatically with the electric poles, there is a possibility that a high voltage difference in the substrate 1 will give rise to damage to the substrate.

Then, the cooling gas 7 is supplied to the back surface of the substrate 1 fixed in such a manner. The cooling gas 7 fills in the indented portion 8 of the holding member 2, the pressure being within the range of several Torrs to several tens of Torrs. When the gap of the indented portion 8 is 15 $\mu$m to 0.1 or 0.2 mm, a decrease in the cooling efficiency can be neglected. That is, the gap needs to be larger than 15$\mu$ when the existence of particles or the roughness of surface is considered, and the upper limit of the gap is 0.2 mm when the thermal conductance of the gas is considered.

It can be considered that the electrostatic adhering force is nearly zero over the indented portion 8 where there is a gap, and is generated only over the protruding portion 3. However, since it is possible to set the adhering force strong enough to endure the pressure of the cooling gas 7 by properly setting the voltage of the direct current power source 13, the substrate 1 is not moved or separated by the cooling gas 7.

The temperature of the holding member 2 is controlled by the coolant 4. Therefore, the molecule of the cooling gas 7 cooled on the surface of the indented portion 8 of the holding member reaches the substrate 1 directly or after any number of collisions with other molecules of the cooling gas. The molecule of the cooling gas which has reached the substrate 1 receives energy from the substrate 1, that is, cools the substrate 1, returning again to the holding member to transfer the heat it carries thereto. By repeating this cycle, the substrate 1 is cooled. In the case where the pressure of the cooling gas 7 is sufficiently higher than the pressure which establishes the mean free path corresponding to the gap at the indented portion 8, it becomes a dominant phenomenon that the gas molecules collide and exchange energy with each other to carry the thermal energy in the substrate 1 to the cooling surface of the holding member 2 in addition to the above-described phenomenon of the gas molecules. However, the thermal energy transport within the range of the present invention involves heat conduction through the cooling gas 7 as a thermal medium. In other words, it is not the phenomenon where, for example, the cooling gas 7 is cooled using a cooling unit separately provided in advance and is supplied to the back surface of the substrate 1 to cool the substrate with the heat capacity of the gas itself. Rather, the gas merely acts as a transport medium for the thermal energy. The gap of the indented portion 8 and the pressure of the cooling gas 7 satisfying the above condition are chosen.

The ratio of energy transport between the cooling gas 7 and the holding member 2 is expressed by a value referred to as a thermal adaptation factor. The thermal adaptation factor depends on the kind of cooling gas and the surface condition of the member (state of contamination etc.). The same can be applied to the heat transfer between the substrate 1 and the cooling gas 7. Helium is used as the cooling gas 7 because helium does not affect the etching characteristic when it leaks, and because the supplying or exhausting time for the cooling gas 7 is shorter than for other gases. However, other gases, such as nitrogen, argon, and an etching gas may be used, although the cooling efficiency is changed. The cooling gas is not specially limited to these examples.

As described above, the substrate 1 is sufficiently cooled through use of the cooling gas. Further, the substrate contacts to the holding member 2 only at the protruding portion 3. Accordingly, foreign substances produced by contacting the back surface of the substrate to another member are likely to attach only to the portions on the back surface of the substrate corresponding to the protruding portion 3. In a case where the substrate 1 has a larger area than the holding member 2 and a part of the surface of the holding member sticks out beyond the edge of the substrate 1 shown in FIG. 2, plasma is irradiated on the exposed projecting surface to etch that surface and the etching reaction products from the substrate 1 are attached to the projecting surface. Thereby, foreign substances attach to the top side surface of the substrate 1 through the sticking surface.

This is the reason why the diameter of the holding member 2 is smaller than the diameter of the substrate 1. However, the effect of decreasing foreign substances on the back surface according to the present invention is not degraded even when the diameter of the holding member 2 is larger than the diameter of the substrate 1.

FIG. 3 shows another form of the substrate holding system 9 according to the present invention. Although the embodiment in FIG. 3 is basically the same as that in FIG. 2, the embodiment in FIG. 3 has a pusher 19 for transferring the substrate 1. The substrate 1 is transferred from the holding member 2 by moving the pusher 19 upward and downward. The pusher 19 has to be moved upward and downward for every treatment. That is, the pusher needs to be moved independently of the holding member 2. Therefore, there is a need to provide a gap between the holding member 2 and the pusher 19. The cooling gas 7 leaks through the gap. The leakage amount of cooling gas 7 needs to be suppressed as much as possible. In order to realize this, an inner side protruded portion 20 having a surface nearly the same height or the same height as that of the protruding portion 3 is provided around the pusher 19. Since the surface is flat and contacts the substrate 1, the leakage amount of the cooling gas can be suppressed within an allowable amount. The reasons why the pusher is provided in the center of the protruded portion 20 are the following three.

(1) For exhausting the excess gas,
(2) for exhausting the foreign substances produced at the pusher portion with the gas flow, and
(3) to prevent an abnormal discharge.

The occurrence of an abnormal discharge depends on the kind of gases used, the pressure of the environment, the gap distance applying voltage and the voltage. In a case where the pusher is placed, for example, in a cooling gas environment, the gap distance applying voltage needs to be 0.16 to 0.2 mm, when the pressure of the cooling gas environment is 8 to 10 Torrs (mHg) and the voltage for electrostatic adhering is 450 to 700 V. However, forming such a gap is difficult. In the case of the embodiment according to the present invention, the pressure of the environment containing the pusher 19 can be made very much lower than the pressure at which discharge is easy to occur, and an abnormal discharge can be prevented from occurring even when the pressure of the environment containing the pusher 19 is higher than the pressure in the etching chamber of 3 to 5 mm Torrs by the pressure difference for increasing conductance, for example, 10 mmTorrs ($1/10^2$ mmHg) and the gap distance is approximately 1 mm.

Figure 4:
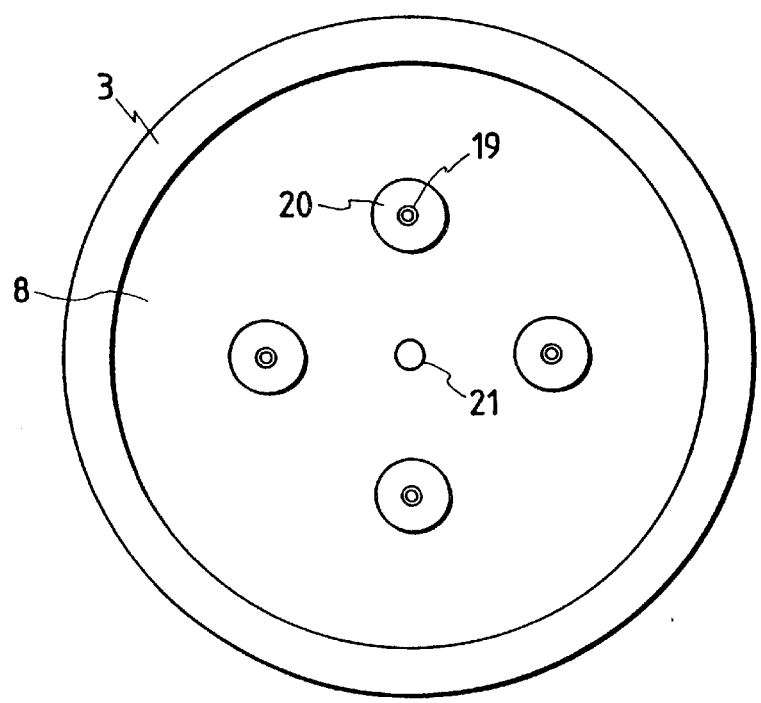
FIG. 4 is a top plan view showing the substrate holding system in FIG. 3.

FIG. 4 is a view of the substrate holding system 9 in FIG. 3 for removing the substrate 1, looking down from an upper side. A feeding and exhausting hole 21 for the cooling gas 7 is provided in the center of the holding member 2, and the pushers 19 and the inner side protruding portions 20 are arranged around the feeding and exhausting hole 21. The inner side protruding portions 20 also serve as supports against the bending of the substrate 1.

Figure 5:
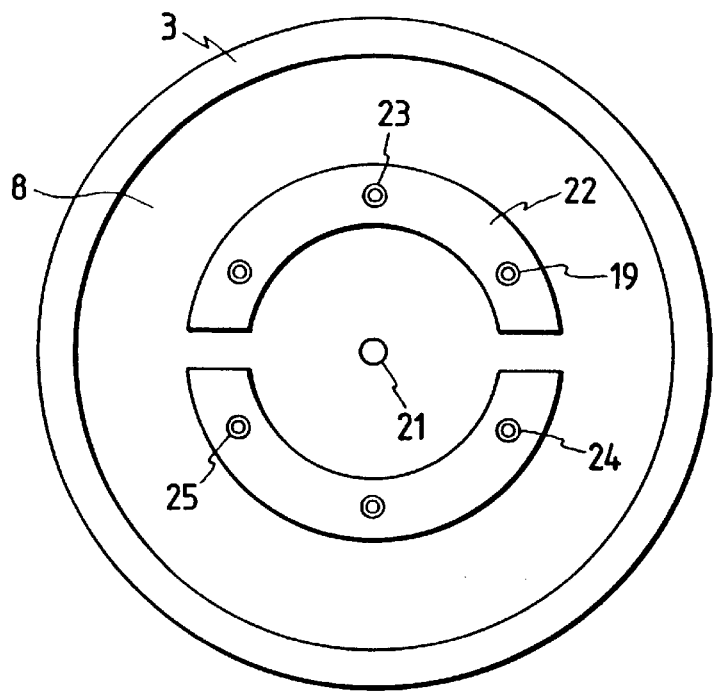
FIG. 5 is a top plan view showing another substrate holding system.

Although the inner side protruding portion 20 is round-shaped in FIG. 4, the shape is not limited to a round-shape. FIG. 5 shows an embodiment of a substrate holding system 9 which is ring-shaped. There are provided in the ring-shaped protruding portions 22 a temperature sensor 23 for the substrate 1, a substrate detecting sensor 24 for detecting the existence of the substrate, an earth terminal 25 for bringing the potential of the substrate 1 to earth potential, in addition to the pusher 19. In order to perform speedy feeding and exhausting of the cooling gas 7 to the indented portion 8, parts of the ring-shaped protruding portion 22 are cut away to allow the cooling gas 7 to pass through the parts easily.

In an apparatus using plasma, employing a fluorescent thermometer as the temperature sensor 23 eliminates the problem of noise. An example of a substrate detecting sensor 24 is an optical fiber through which a laser beam is introduced to irradiate the back surface of the substrate 1. The presence of the substrate 1 is detected by the existence of reflected light. Since the output of the temperature sensor 23 changes depending on the presence of the substrate 1, the change can be used in detecting presence of the substrate 1.

The earth terminal is used before pushing up the substrate 1, which has been electrostatically fixed, by using the pusher 19. While there remains an adhering force on the substrate 1 which has been electrostatically fixed, the pusher 19 cannot be used. Therefore, in order to shorten the waiting time, there are some cases where the substrate 1 is required to be grounded. By moving the earth terminal 25 upward and downward so as to contact the substrate 1, the potential Of the substrate 1 is neutralized. Although the earth terminal 25 is made of an electrically conductive material, it is effective to employ silicon carbide having a much larger resistivity than general metals to avoid an abnormal discharge during plasma treatment. Further, it is possible that the function of grounding may be incorporated in the pusher 19.

Although various kinds of sensors are arranged on a single holding member in FIG. 5, the sensors can be used separately without degrading the object of the present invention.

By employing the substrate holding system 9 according to the present invention, the amount of foreign substances attaching to the back surface of the substrate 1 is decreased. Further, by holding the substrate 1 during treatment using the substrate holding system, it is possible to prevent foreign substances carried on the back surface from attaching to the top surface of another adjacent substrate, which could contaminate the substrate by foreign substances melted or detached from the back surface.

Figure 6:
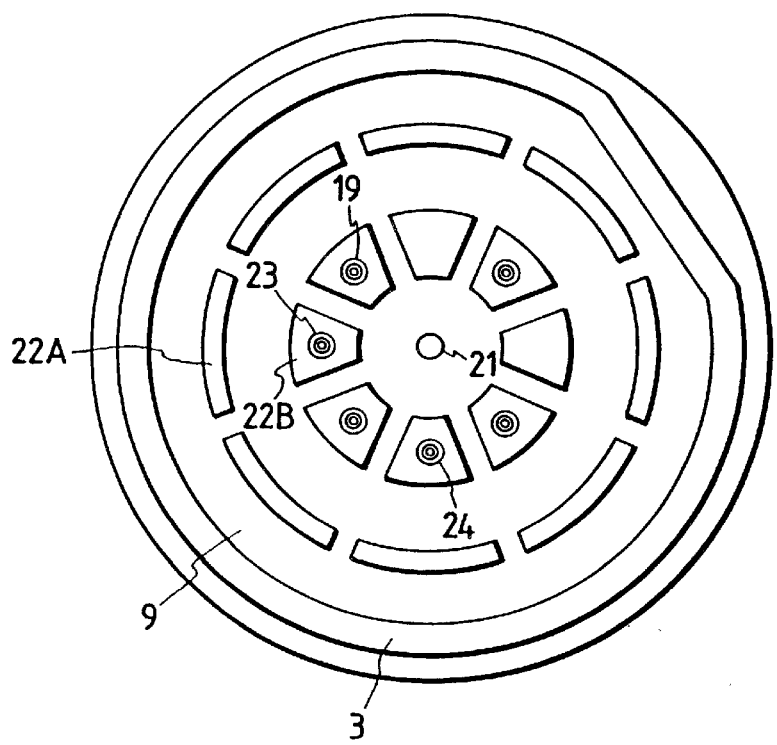
FIG. 6 is a top plan view showing a further substrate holding system.

FIG. 6 shows a further form of the substrate holding system 9 according to the present invention. The holding member 2 has island-shaped protruding portions 22A, 22B arraying concentrically. In this embodiment, a substrate is supported with three concentric portions, the protruding portion 3 in the peripheral area, and the island-shaped protruding portions 22A and 22B. This configuration is especially effective when the diameter of the substrate 1 is large.

Figure 7:
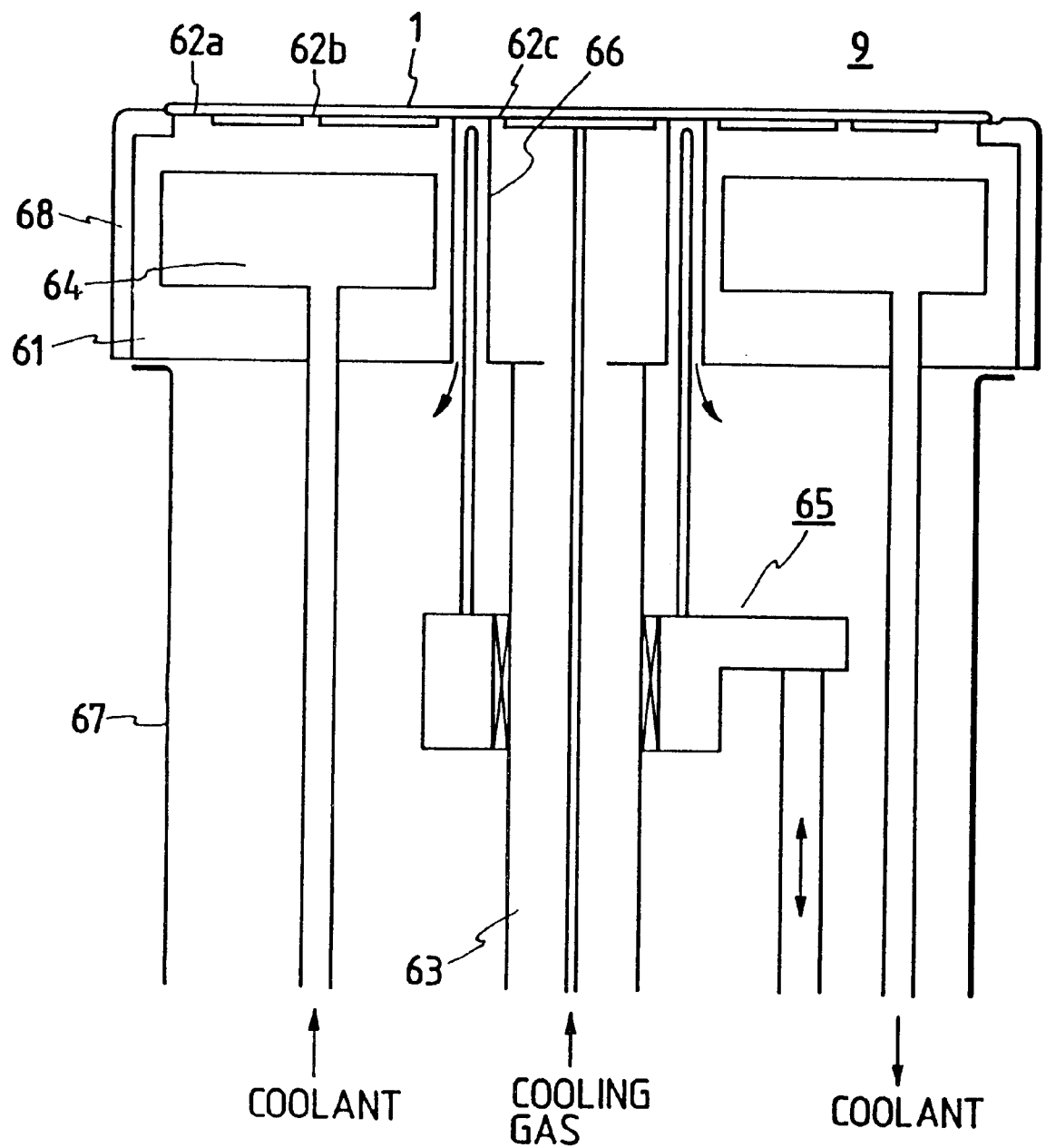
FIG. 7 is a vertical cross-sectional view showing another substrate holding system in accordance with the present invention.
Figure 8:
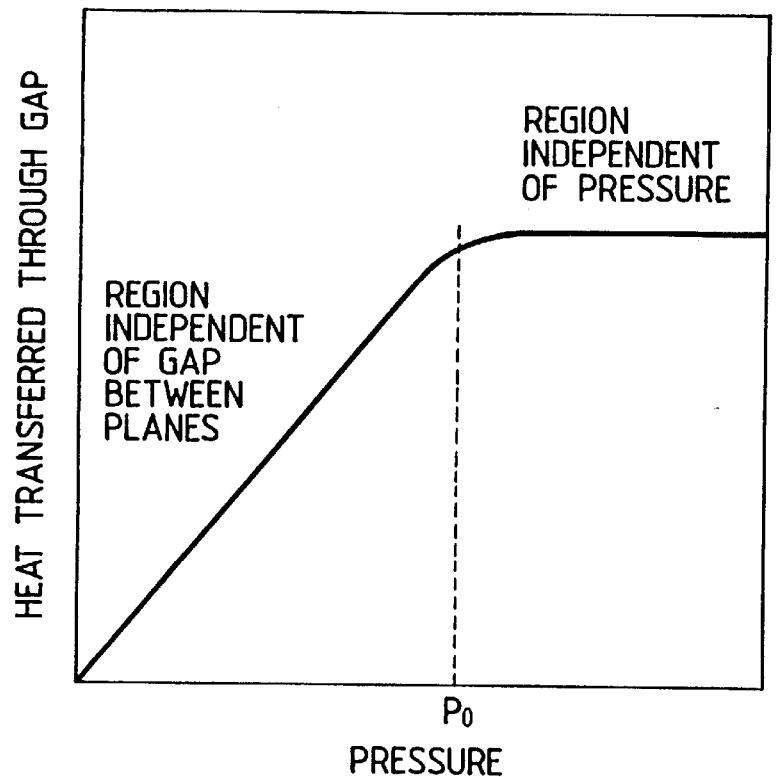
FIG. 8 is a view explaining the heat transfer characteristic in a vacuum.

FIG. 7 shows another embodiment according to the present invention. FIG. 7 is a detailed cross-sectional view showing a substrate holding system 9 of a microwave plasma etching apparatus to be described later. An insulating film for electrostatic adhering is coated on the top surface of a head portion 61. A weir 62a for contacting and fixing a substrate 1 is provided at the periphery of the substrate, and a weir 62b and a weir 62c are provided inwardly of the weir 62a. A hole 66 penetrating to the back surface of a mounting table is provided in the center of the weir 62c. A space 64 for containing coolant is provided inside the head portion 61, and a passage capable of feeding and exhausting the coolant is provided in communication with the space 64. A shaft 63 secured to the head portion 61 is provided near the center of the substrate holding system 9, and a guiding passage for introducing cooling gas is provided inside the shaft. A pusher mechanism 65 for transporting a substrate is provided in engaging relationship with the hole 66 described above. A cover 67 is placed in the outer peripheral portion of the penetrating hole 66 on the back of the mounting table. A susceptor 68 serves as a cover for head portion 61 to protect the head portion 61 during etching and to insulate the side surface of the head portion from the surrounding electrical space.

In a case where a substrate 1 (wafer) is treated in the embodiment in FIG. 7, the substrate 1 is introduced into a treating chamber using loading means (not shown) under a vacuum condition, the substrate 1 is mounted on a mounting table 9 having its temperature controlled in advance with a coolant, current is supplied to an electromagnetic coil 4A (see FIG. 10) to form a given magnetic field, a treating gas is introduced, current is supplied to a magnetron to generate microwave energy, the gas is turned into a plasma in the treating chamber by ECR (electron cyclotron resonance), and a DC circuit is formed by the plasma to produce an electrostatic adhering force. Then, a cooling gas is caused to flow between the substrate 1 and the mounting table 9. The cooling gas rapidly diffuses inside the gap, except for contact portions thereby transferring the heat entering from the plasma into the substrate 1 (wafer) to a head portion of the holder by way of the coolant. In order to extend the cooling effect up to the vicinity of the outer periphery of the substrate, the cooling gas is leaked to the treating chamber through the outer periphery of the substrate. At the same time, the cooling gas is exhausted to the back of the mounting table as an excess gas through a penetrating hole 66 having a dimensional relationship so as to leak the cooling gas actively. Since the gas between the substrate and the mounting table needs to be maintained above a given pressure, gas is always supplied in an amount corresponding to the leaked amount.

According to the embodiment, it is possible to provide a plasma treating apparatus in which the amount of foreign substances transferred to the back surface of a substrate is decreased by decreasing the contact area between the substrate and the holder while maintaining the cooling gas pressure required for cooling, and which has a good repeatability as a production apparatus, being capable of treating a substrate with plasma under a condition of controlling the substrate temperature, and having excellent productivity.

Further, it is possible to provide a plasma treating apparatus in which the foreign substances produced in the pusher portion are transported to the opposite side of the substrate by exhausting the excess cooling gas to the back of the mounting table (opposite side of the substrate) to decrease the amount of foreign substances attaching to the substrate; and concurrently, the gas is exhausted inside a cover provided on the back of the mounting table in the treating chamber to keep the pressure inside the cover higher than the pressure in the treating chamber and to prevent the reaction products from attaching to the mechanisms of the mounting table, and of which the characteristic is small time-varying.

Helium is generally used as the cooling gas here. Although in the present invention the cooling gas leaks into the treating chamber by several ccm (cubic centimeter per minute) to 10 ccm, it has been confirmed by experiment that the leakage amount does not affect the process, since the amount is $1/100$ to 1/several tenths of the supplied amount of process gas.

Although the present invention has been described in each of the above embodiments while taking substrate cooling into consideration, it is understood that there is no substantial difference in a case of heating a substrate, since the only difference is that the temperature of the holding member is kept higher than the temperature of the substrate.

According to the present invention, a substrate can be certainly cooled and at the same time the amount of foreign substances attached to the back surface of the substrate can be decreased. Further, the amount of foreign substances attached to the top surface of the substrate also can be decreased since the substrate is fixed using electrostatic adhesion and there is no need to use any substrate fixing hardware which will contact the substrate on the top surface of the substrate. Furthermore, substrate treatment on the top surface of a substrate can be performed throughout the surface of the substrate since there is no obstacle, such as substrate fixing hardware. Therewith, the yield of production in substrate treatment can be improved by decreasing the amount of foreign substances on the back surface. The yield of production can be further improved and the number of device chips obtained from a single substrate also can be increased by decreasing the amount of foreign substances attached to the top surface of the substrate.

Damage to the substrate such as results from use of a conventional electrostatic adhering electrode is not caused in the present invention, which improves the yield of production.

Another embodiment of the present invention will be described in detail below, referring to the drawings.

Figure 9:
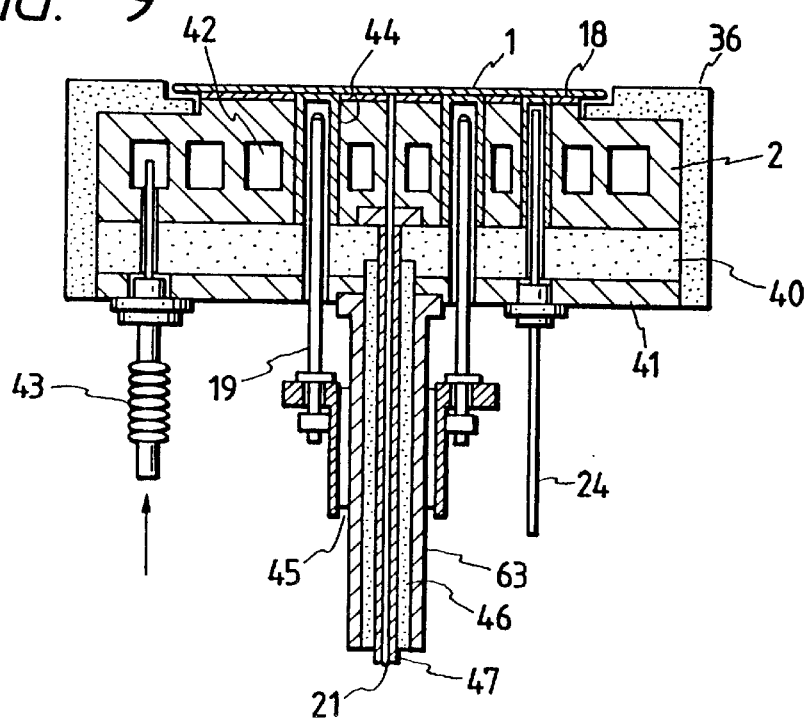
FIG. 9 is an explanatory view showing another substrate holding system in accordance with the present invention.

FIG. 9 shows another embodiment in accordance with the present invention. In FIG. 9, a substrate 1 is held on a dielectric material 18 formed on a holding member 2. Under the holding member 2, an insulating member 40 and a base 41 are placed and supported with a shaft 63. In the holding member 2, a coolant flow passage 42 for conducting a coolant to control the temperature of the substrate 1 is formed. In order to supply the coolant to the coolant flow passage 42, a through hole penetrating through the base 41 and the insulating member 40 is provided and a coolant supply portion 43 is also provided. A pusher 19 is inserted in a through hole penetrating through the holding member 2, the insulating member 40 and the base 41, the side surface of the through hole being formed of an insulating pipe 44. The pusher 19 is guided with a guide 45 provided around the shaft 63, being moved in the direction of the shaft 63 with an upward and downward drive mechanism, which is not shown in the figure, to transport the substrate 1. A high frequency supplying shaft 47 is installed inside the shaft 63 through an insulating material 46, the high frequency supplying shaft 47 being pipe-shaped, and the inside of the high frequency shaft forms a substrate cooling gas feeding hole 21. The insulating material 46 penetrates from the base 41 to the insulating member 40. The high frequency supplying shaft 47 penetrates from the insulating member 40 to the holding member 2, one end (lower side in FIG. 9) of the high frequency supplying shaft 47 being connected to a high voltage power source, which is not shown in the figure, for applying a high voltage to hold the substrate 1 to the dielectric material 18 by electrostatic adhesion and to a power source for applying a high frequency bias to the substrate 1. A substrate detecting sensor 24 for detecting the presence or absence of a substrate by detecting the temperature of the substrate is installed in FIG. 9. In this position, a substrate detector which operates to detect cooling gas pressure instead of detecting the substrate temperature may be also employed. In this case, the pressure sensor is placed at the top end of the pin in the substrate detecting sensor 24, and an output signal wire from the pressure sensor is passed through the inside of the pin to be connected to a signal processor. Since the pressure in the space around the top end of the pin in the substrate detecting sensor 24 is high when a substrate is present and is low when a substrate is absent, the signal processor detects the presence or absence of the substrate by judging whether or not the pressure signal from the pressure sensor exceeds a value corresponding to a preset pressure. A susceptor 36 serving as a cover for the dielectric material 18 and the holding member 2 is placed on the outer peripheral portion of the substrate 1 to cause the gas flow for substrate etching to be uniform. The inner peripheral surface of the susceptor 36 is perpendicular to the back surface of the substrate 1. The susceptor 36 is formed of an electrically insulating material, such as alumina, covering the outer surrounding surface of the holding member 2, the insulating member 40 and the base 41.

Figure 10:
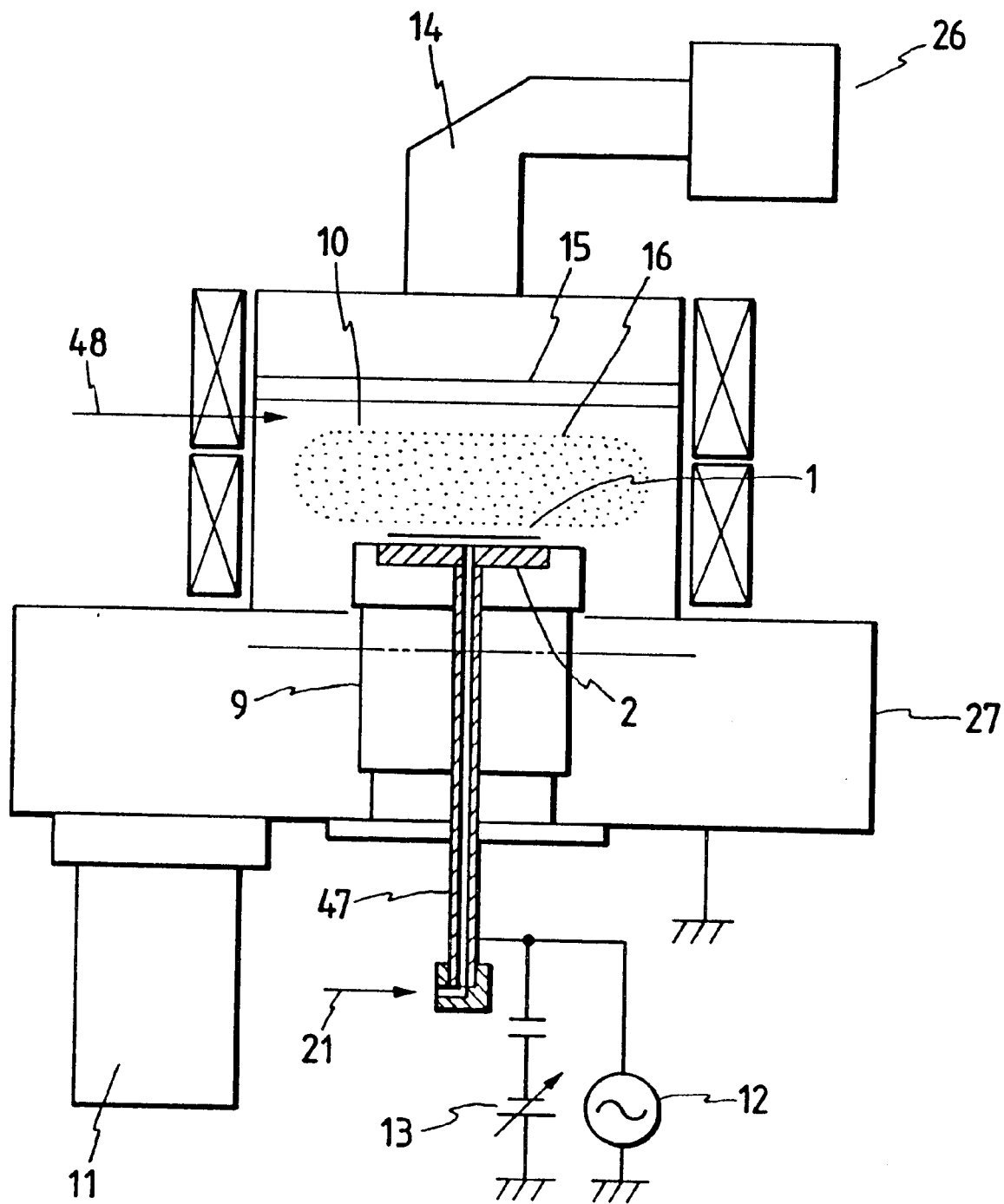
FIG. 10 is an explanatory view showing a substrate etching apparatus having a substrate holding system in accordance with the present invention.
Figure 11:
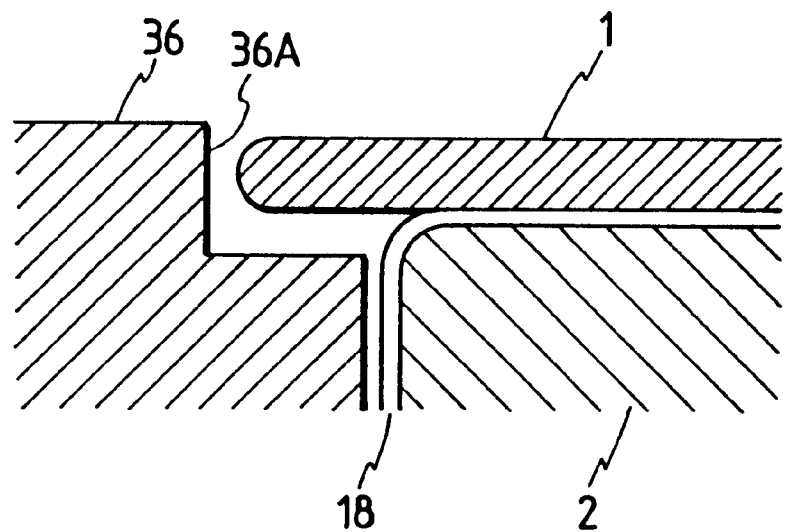
FIG. 11 is an enlarged view showing the outer peripheral portion of the substrate holding system of FIG. 9.

The substrate holding system shown in FIG. 9 is used in, for example, a plasma environment as shown in FIG. 10. FIG. 11 is an enlarged cross-sectional view of the peripheral portion of the substrate 1. Although FIG. 10 is a schematic view of a microwave plasma etching apparatus, explanation will be made below on a case where the substrate holding system according to the present invention is applied to an etching apparatus.

The vacuum chamber 27 is connected to another vacuum chamber to load and unload the substrate 1 from and into the atmospheric environment through a valve. The substrate 1 loaded into the vacuum chamber 27 through the substrate loading mechanism is transported at a transporting level indicated by a two-dot chain line in FIG. 10. Therefore, the substrate holding system 9 is lowered to the transporting level. The substrate 1 is transported to and mounted on the dielectric material surface 18 by moving the pusher 19 upward and downward at this level. The coolant to control the temperature of the substrate 1 is introduced into the coolant flow passage 42 from the coolant supply portion 43 through a coolant temperature controller which is separately provided and the coolant is recirculated in the coolant flow passage to control the temperature of the holding member 2 and the dielectric material 18 at a given temperature. When the substrate 1 is mounted on the substrate holding system 9, a laser beam introduced from the substrate detecting sensor 24 is reflected on the back surface of the substrate, the reflected light being detected as a signal which confirms the mounting of the substrate 1. The temperature of the substrate is started to be detected using a substrate temperature detector (fluorescent thermometer), which is not shown in FIG. 9, installed in the same manner as the substrate detecting sensor 24. When the etching gas 48 is supplied and the microwave energy is introduced, from the microwave generator 26 through the wave guide 14 discharging is started. In this state, a direct current for electrostatic adhesion is supplied from the direct current power source 13, an electric circuit for electrostatic adhesion is formed through the plasma 16, and the substrate 1 is attracted to the dielectric material 18. Then, when helium gas is supplied from the gas feeding hole 21, substrate temperature control through the helium gas is carried out. In this state, since the preparation for etching is completed, etching is started by setting the microwave at a given value and applying the high frequency voltage. After completion of the etching treatment, supply of the high frequency voltage is stopped. At this time, the plasma still remains. That is, the substrate is still attracted electrostatically. The supply of etching gas is stopped and a, non-etching gas, such as argon gas, instead of the etching gas, is introduced, depending on the situation, to remove the charge accumulated during electrostatic adhering. In the meanwhile, the supply of helium gas is stopped, and the force to lift up the substrate 1 from the back surface of the substrate 1 is not applied. After completion of discharging, the supply of argon gas is stopped, and the direct current for electrostatic adhesion is stopped. After exhausting the etching gas and the gas for discharge to achieve a high vacuum state, downward movement of the substrate holding system 9 and the process for unloading the substrate 1 are started. The unloading process is performed in the inverse process of the loading process. A new substrate is loaded for the next etching. Then, etching is carried out in the same manner as above.

Although the reaction products (gas) produced by the etching gas and etching on the surface of the substrate is distributed in an approximately uniform density over the surface of the substrate 1, the etching characteristic in the peripheral portion may be different from that in the central portion since in the outer peripheral portion of the substrate the portion to produce the reaction products does not exist outside the substrate and the flow boundary of gas flow abruptly changes. Therefore, in accordance with the present invention, the susceptor 36 is placed approximately at the same level as the substrate 1 to prevent any abrupt change in the gas flow. The flow of the etching gas and the reaction products is directed slightly upward due to the existence of the surface of the susceptor 36, and a stagnant effect of the etching gas and the reaction products takes place and causes a phenomena as if there is an etching reaction portion in the outer peripheral portion of the substrate. Therefore, etching is uniformly performed in the peripheral portion of the substrate.

In addition to the above, there is an effect that, since the periphery of the substrate 1 is in a state of being contained in the susceptor 36 and the side wall 36A of the susceptor 36 restricts the substrate 1 from shifting to any significant extent, it is possible to avoid the situation where the substrate cannot be transported and the vacuum of the etching chamber has to be broken even when the electrostatic adhering force is removed with some abnormal state and the substrate 1 is moved by the pressure of the helium gas supplied to the back surface of the substrate 1. At this time, the substrate 1 does not ride on the horizontal surface of the susceptor 36 even when the substrate 1 slides, because the inner surface 36A of the susceptor 36 facing the outer peripheral surface of the substrate 1 is nearly vertical. This case is different from a case where the surface of the susceptor 36 is taper-shaped.

Description will be made below on the gap between the back surface of the substrate 1 and the susceptor 16.

On the substrate etching surface side, the plasma 16 is generated and the etching gas and the reaction products are flowing. Therefore, when there is a gap between the back surface of the substrate 1 and the susceptor 36, the etching gas and the reaction products enter into the gap and are accumulated in the back surface of the substrate. They form foreign substances. This is not desirable, because the product yield of the etching process decreases. On the other hand, when the gap between them is decreased so as to be as small as possible, the etching gas and the reaction products are decreased to enter the gap and the foreign substances accumulated in the back surface of the substrate can be deceased. According to the result of another experiment, the effect described above has been effective when the gap is less than 0.3 mm.

The etching treatment is performed while applying the high frequency voltage to the substrate 1. At this time, there are some cases where an abnormal discharge takes place between the holding member 2 to which the high frequency voltage is directly applied and the base 41. When the abnormal discharge occurs, the high frequency voltage is not correctly applied to the substrate 1, and the etching itself becomes abnormal. This is not limited to etching, but can be said generally of the type of substrate treating apparatus in which plasma is generated using a high frequency voltage. In order to prevent such phenomena, in the substrate holding system according to the present invention, the base 41, being at a different electric potential from the high frequency voltage applied portion, is specially isolated by inserting the insulating pipe 44. Thereby, the abnormal discharge can be prevented.

Figure 12:
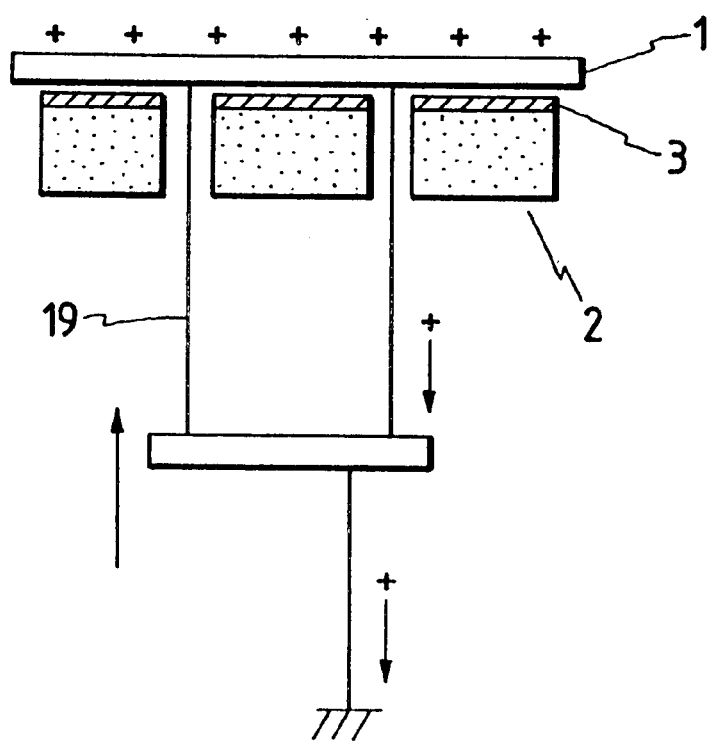
FIG. 12 is an explanatory view showing removing accumulated charge during transporting a substrate.

Description will be made on transportation of the substrate 1. Charge is accumulated on the substrate 1 while it is electrostatically fixed on the holder. The charge has the capability of adhering the substrate 1 to the dielectric material 18, and so the substrate 1 is electrostatically attracted to the dielectric thin film even when the direct current power source 13 for electrostatic adhesion is switched off. Therefore, transportation of the substrate 1 has to be delayed until the accumulated charge disappears. There is an additional problem of determining whether the accumulated charge is present or absent. In order to solve this problem, the pusher 19 is made of a material having a small conductivity, such as silicon carbonate, as shown in FIG. 12. By doing so, the accumulated charge flows to a grounded line through the pusher 19 to cause the charge to disappear. Thereby, the problem of transporting the substrate can be avoided and a reliable substrate transportation can be realized. The grounded circuit connected to the pusher 19 may be disconnected during generation of the plasma. It is preferable to employ this technique when the grounded line and the high frequency applied portion are placed near each other and an abnormal discharge takes place.

Although the substrate 1 is transported with upward/downward movement of the pusher 19, an abnormal state occurs if the substrate is vibrated during transporting. Therefore, the pusher 19 has to move smoothly. In order to guide the pusher with certainty, in accordance with the present invention, the guide 45 is provided on the shaft 63. By doing this, the length of the pusher 19 does not become excessively long and a highly reliable transportation can be realized.

As described above, the elements of a highly reliable substrate holding system have been explained. Description will be made below on the solution of the problem in a case where the substrate transporting level is different from the level of the substrate treating position (the substrate position corresponding to the position illustrated in FIG. 10).

Figure 13:
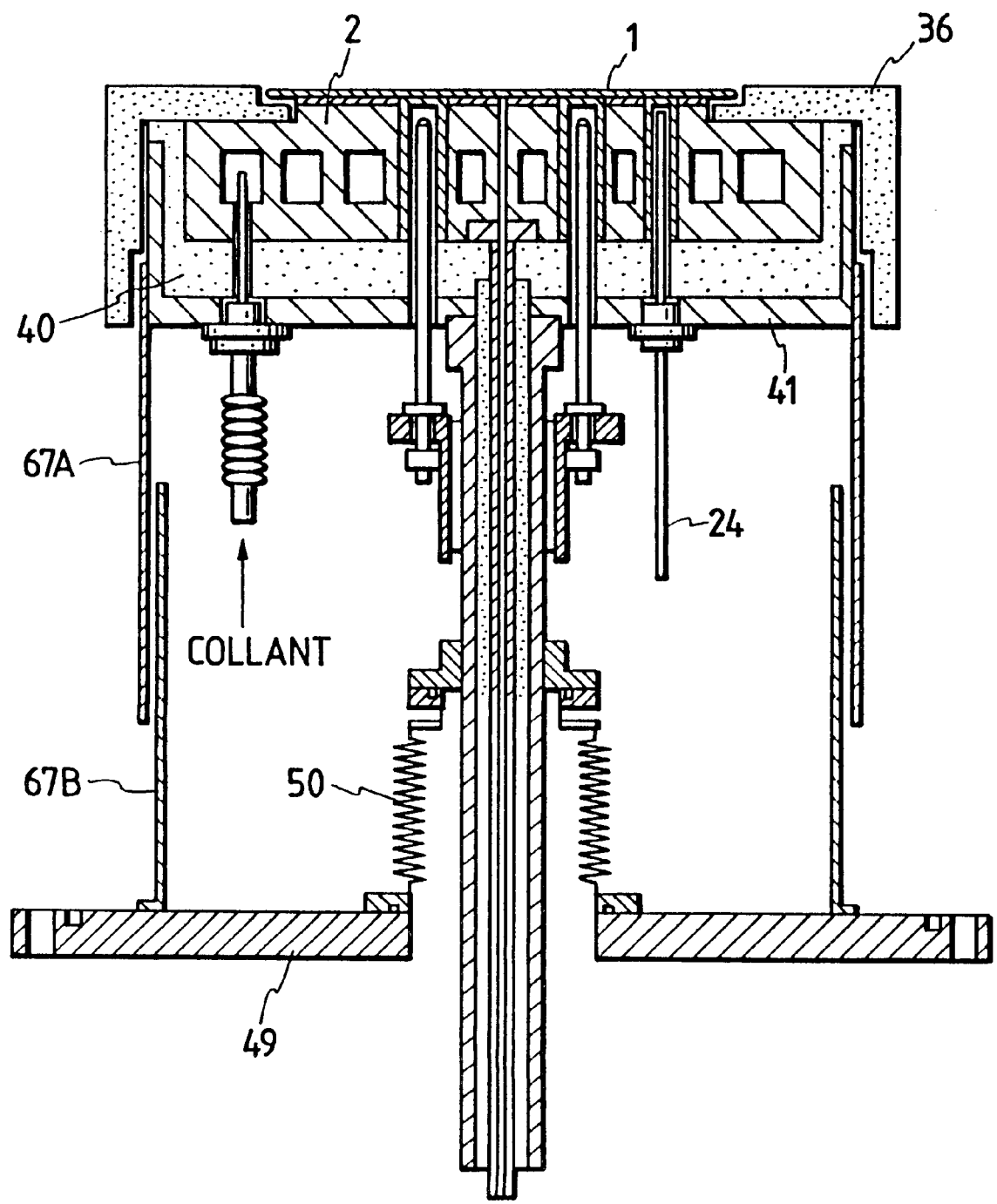
FIG. 13 is a vertical cross-sectional view showing another substrate holding system in accordance with the present invention.

FIG. 13 shows the comprehensive construction of a substrate holding system. The upper portion of the system is nearly the same as in FIG. 9. The main difference from FIG. 9 is that the outer side surface of the holding member 2 applied with the high frequency voltage is covered with an insulating member 40. By doing so, the distance between the portion to which the high frequency voltage is applied and the grounded portion becomes long and the preventive effect against abnormal discharge can be improved.

In order to travel upward and downward between the substrate transporting position and the substrate etching position, a bellows 50 is provided between the shaft 63 of the substrate holding system and the flange 49 in the present invention. The bellows 50 also serves as a vacuum seal between the atmosphere and the etching chamber and is extended with a guide for the shaft 63 and an upward and downward drive mechanism installed in the atmospheric environment, which are not shown in FIG. 13. In accordance with the present invention, the bellows is placed between the shaft 63 and the flange 49 to minimize the diameter of the bellows 50. When the diameter of the bellows 50 is small, the force loaded on the substrate transporting mechanism is also small and consequently it is easy to make the upward and downward drive mechanism simple and highly accurate. It is needless to say that the foreign substances produced by abrasion in the sliding portion are eliminated and the reliability of the vacuum seal is improved in comparison to a case of employing a sliding portion using an elastomer seal.

Although by employing such a construction the substrate holding system is moved upward and downward, exposure of the bellows 50, the shaft 63, and the pusher 19 to the plasma is not preferable from the point of view of foreign substances formed by attached etching products or the plasma resistivity of the materials. Therefore, in the present invention, cylindrical covers 67A and 67B engaging with each other are provided on the base 41 and on the flange 49. The covers 67A, 67B engage with each other and have such dimensions that the contact is maintained even when the substrate holding system moves upward and downward. The covers 67A and 67B are kept at a grounded electric potential, and so the members inside the covers are always isolated from the plasma so as to be protected from contamination.

As described in the above embodiment, according to the present invention, a substrate holding system and a method of holding a substrate having less foreign substances and which is capable of performing uniform etching can be attained.

It is understood that the present invention is not limited to the described etching apparatus, but is widely applicable to various substrate treating apparatus and treating holding of a substrate (treated object) with electrostatic adhesion.

In looking at FIG. 9 or FIG. 13 from the point of view of manufacture of the substrate holding system, it is difficult to manufacture the holding member 2 since it has the coolant flow passage. As a matter of course, it is possible to obtain a member having the same effect by manufacturing the holding member 2 by dividing it into two parts through machining, as shown in FIG. 9, jointing the parts to each other, and sealing the coolant using an elastomer seal. However, in this case, there arise such problems as an increase in complexity and a decrease in reliability due to extra jointing portions or extra volume being required, since a sealing surface 55 is required, and a seal is required in each hole of the parts when a through hole (for example, the hole inserted with the insulating pipe 44 in FIG. 9) is provided in the holding member 2, as shown in FIG. 9.

Therefore, the present invention employs a manufacturing method where the holding member 2 is formed in a one-piece structure.

Figure 14:
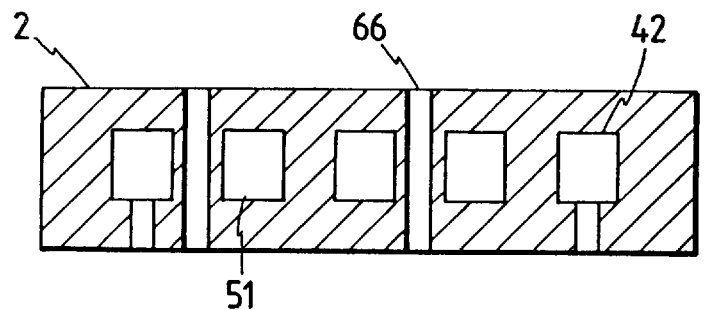
FIG. 14 is an explanatory view showing a method of manufacturing the coolant flow passage in the substrate holding system of the present invention.

In the present invention, a lost wax technique is employed as a method to solve this problem. FIG. 14 shows this embodiment. First, a member 51 having the same shape as the coolant flow passage 42 is fabricated using wax. Next, a mold having the same shape as the outer shape of the holding member 2 is prepared, the flow passage mold made of wax being placed inside the mold, and then casting is performed. After removing the wax, the holding member 2 is completed.

Figure 15:
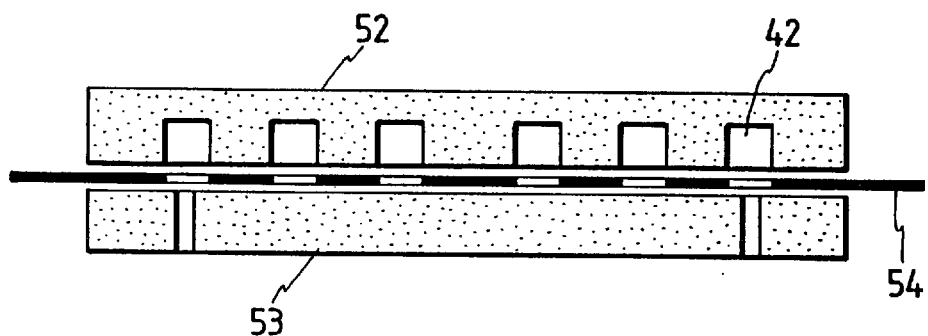
FIG. 15 is an explanatory view of another substrate holding system.
Figure 16:
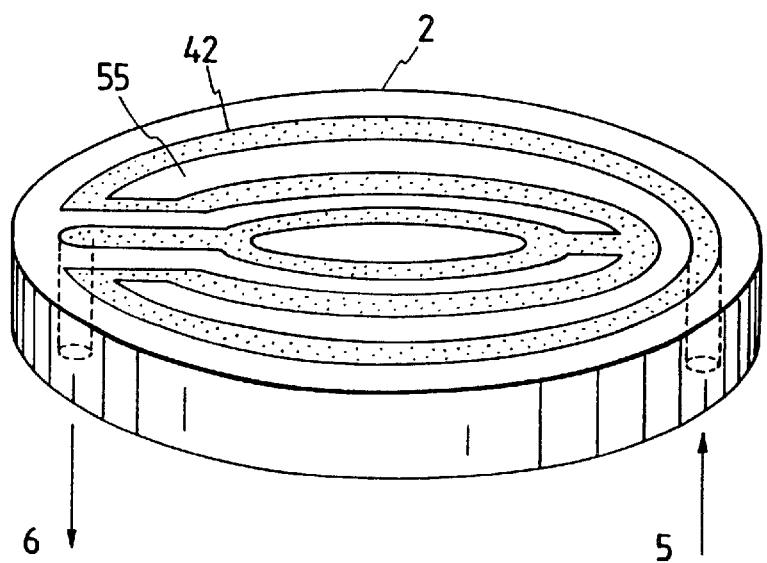
FIG. 16 is an explanatory view of the coolant flow passage of a holding member in FIG. 15.

FIG. 15 and FIG. 16 show another embodiment according to the present invention. In this embodiment, a metallic member 52, which is machined to form the coolant flow passage 42 in advance, and a holding member 53 are coupled with each other through a jointing material 54. When the holding member is made of aluminum or an aluminum alloy, an aluminum alloy having a low melting temperature (for example, a silicon contained aluminum alloy) is used for the jointing material 54. Then, the members 52, 53 are heated up to approximately 600° C. in a vacuum environment with pressing, the jointing material 54 having a low melting temperature being melted and reacting with the metallic members 52 and 53 to be jointed to each other. Since the sealing surface 55 shown in FIG. 16 can be certainly jointed by employing the diffusion welding method, the through hole 66 can be made without any special consideration. Since in the welding process many sets of members, not limited one set, can be welded at a time, there is no problem in cost performance by manufacturing a lot of the metallic members 52, 53 in advance and welding them at the same time.

As described above, according to the present invention, since substrate holding by electrostatic adhesion can be certainly preformed without using a member, such as a weight, on the substrate surface for preventing sliding during substrate transporting or for preventing lift-up due to gas pressure on the back surface of the substrate, there is an effect that production of foreign substances during substrate etching can be decreased and the production yield of the substrate can be expected to be improved. Further, since the operable period between cleaning services of the substrate etching apparatus for removing the foreign substances is lengthened, there is an effect that the operability of the apparatus can be expected to be improved. Furthermore, since the surface of the outer peripheral portion of the substrate is nearly at the same level as the surface of the substrate in order to make the gas flow in the surface of the substrate uniform, there is an effect that the substrate etching can be performed with excellent uniformity over the surface. Still further, since no elastomer seal is required for coolant sealing in forming the substrate holding system, there is an effect that the substrate holding system can be easily manufactured.

What is claimed is:

1. A substrate holding system for holding a substrate on a specimen table, and supplying a back side gas between the specimen table and said substrate, which comprises:

a periphery holding portion having a surface disposed on said specimen table in a position corresponding to the periphery of said substrate;

an internal holding portion disposed on said specimen table to support said substrate at a corresponding position between the periphery of said substrate and the center of said substrate; and electrostatic attraction means for fixing said substrate on said holder so that the back surface of said substrate contacts the periphery holding portion and the internal holding portion, wherein the back side gas is supplied through a feed hole located in a recessed portion of the specimen table;

wherein the internal holding portion includes a through hole and a pin for pushing the substrate off of the specimen table.

2. A substrate holding system according to claim 1, wherein the height of the periphery holding portion and the internal holding portion is 15 $\mu$m~200 $\mu$m.

3. A substrate holding system according to claim 1, wherein the area of the periphery holding portion and the internal holding portion which contacts the substrate is less than one half of the area of the substrate.

4. A substrate holding system according to claim 1, wherein the recessed portion of the specimen table is located under the center of the substrate.

5. A substrate holding system in a plasma treatment apparatus having a vacuum treating chamber, gas introducing means and a specimen table mounting a substrate in the vacuum treating chamber where the substrate is held to the specimen table with electrostatic adhesion force, comprising:

a periphery holding portion having a surface protruding from a holding member in a position corresponding to the periphery of the substrate; and an internal holding portion disposed on said holding member to support said substrate at a corresponding position between the periphery of said substrate and the center of said substrate;

wherein said substrate holding system further comprises:
   electrostatic attraction means for fixing said substrate on said holder so that the back surface of said substrate contacts the periphery holding portion and the internal holding portion, wherein the back side gas is supplied through a feed hole located in a recessed portion of the specimen table; and wherein the internal holding portion has a through hole and a pin for pushing the substrate off of the specimen table.

6. A substrate holding system according to claim 5, wherein the recessed portion of the specimen table is located under the center of the substrate.

7. A substrate holding system which holds a substrate on a specimen table, and supplies a back side gas between the specimen table and said substrate, which comprises:

a periphery holding portion having a surface disposed on said specimen table in a position corresponding to the periphery of said substrate;

an internal holding portion disposed on said specimen table to support said substrate at a corresponding position between the periphery of said substrate and the center of said substrate; and electrostatic attraction circuitry to generate electrostatic attraction at the specimen table to fix said substrate on said holder so that the back surface of said substrate contacts the periphery holding portion and the internal holding portion, wherein the back side gas is supplied through a feed hole located in a recessed portion of the specimen table, and wherein the internal holding portion includes a through hole and a pin to push the substrate off the specimen table.

8. A substrate holding system according to claim 7, wherein the electrostatic attraction circuitry is adjustable to control the amount of electrostatic attraction at the specimen table.

9. A substrate holding system according to claim 7, wherein the recessed portion of the specimen table is located under the center of the substrate.

10. A substrate holding system for holding a substrate on a specimen table, and supplying a back side gas between the specimen table and said substrate, which comprises:

a periphery holding portion having a surface disposed on said specimen table in a position corresponding to the periphery of said substrate;

an internal holding portion disposed on said specimen table to support said substrate at a corresponding position between the periphery of said substrate and the center of said substrate, wherein the internal holding portion is separated from the periphery holding portion by a recessed portion in the specimen table; and electrostatic attraction means for fixing said substrate on said holder so that the back surface of said substrate contacts the periphery holding portion and the internal holding portion, wherein the internal holding portion includes a through hole and a pin for pushing the substrate off of the specimen table.

11. A substrate holding system according to claim 10, wherein the height of the periphery holding portion and the internal holding portion is 15 μm~200 μm.

12. A substrate holding system according to claim 10, wherein the area of the periphery holding portion and the internal holding portion which contacts the substrate is less than one half of the area of the substrate.

13. A substrate holding system according to claim 10, wherein the back side gas is supplied through a feed hole located in a second recessed portion of the specimen table.

14. A substrate holding system according to claim 13, wherein the second recessed portion of the specimen table is located under the center of the substrate.

15. A substrate holding system in a plasma treatment apparatus having a vacuum treating chamber, gas introducing means and a specimen table mounting a substrate in the vacuum treating chamber where the substrate is held to the specimen table with electrostatic adhesion force, comprising:

a periphery holding portion having a surface protruding from a holding member in a position corresponding to the periphery of the substrate; and an internal holding portion disposed on said holding member to support said substrate at a corresponding position between the periphery of said substrate and the center of said substrate, wherein the internal holding portion is separated from the periphery holding portion by a recessed portion in the specimen table;

wherein said substrate holding system further comprises:
electrostatic attraction means for fixing said substrate on said holder so that the back surface of said substrate contacts the periphery holding portion and the internal holding portion, wherein the internal holding portion has a through hole and a pin for pushing the substrate off of the specimen table.

16. A substrate holding system according to claim 15, wherein the back side gas is supplied through a feed hole located in a second recessed portion of the specimen table.

17. A substrate holding system according to claim 16, wherein the second recessed portion of the specimen table is located under the center of the substrate.

18. A substrate holding system which holds a substrate on a specimen table, and supplies a back side gas between the specimen table and said substrate, which comprises:

a periphery holding portion having a surface disposed on said specimen table in a position corresponding to the periphery of said substrate;

an internal holding portion disposed on said specimen table to support said substrate at a corresponding position between the periphery of said substrate and the center of said substrate, wherein the internal holding portion is separated from the periphery holding portion by a recessed portion in the specimen table; and electrostatic attraction circuitry to generate electrostatic attraction at the specimen table to fix said substrate on said holder so that the back surface of said substrate contacts the periphery holding portion and the internal holding portion, wherein the internal holding portion includes a through hole and a pin to push the substrate off the specimen table.

19. A substrate holding system according to claim 18, wherein the electrostatic attraction circuitry is adjustable to control the amount of electrostatic attraction at the specimen table.

20. A substrate holding system according to claim 18, wherein the back side gas is supplied through a feed hole located in a second recessed portion of the specimen table.

21. A substrate holding system according to claim 20, wherein the second recessed portion of the specimen table is located under the center of the substrate.

* * * * *